(12) United States Patent
Zeng et al.

(10) Patent No.: US 9,337,017 B2
(45) Date of Patent: May 10, 2016

(54) METHOD FOR REPAIRING DAMAGES TO SIDEWALLS OF AN ULTRA-LOW DIELECTRIC CONSTANT FILM

(71) Applicants: Shaohai Zeng, Shanghai (CN); Qingyun Zuo, Shanghai (CN); Ming Li, Shanghai (CN)

(72) Inventors: Shaohai Zeng, Shanghai (CN); Qingyun Zuo, Shanghai (CN); Ming Li, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 0 days.

(21) Appl. No.: 14/758,307

(22) PCT Filed: Aug. 11, 2014

(86) PCT No.: PCT/CN2014/084099
§ 371 (c)(1),
(2) Date: Jun. 29, 2015

(87) PCT Pub. No.: WO2015/062331
PCT Pub. Date: May 7, 2015

(65) Prior Publication Data
US 2015/0340227 A1    Nov. 26, 2015

(30) Foreign Application Priority Data
Oct. 30, 2013    (CN) .......................... 2013 1 0525014

(51) Int. Cl.
*H01L 21/02* (2006.01)
*H01L 21/302* (2006.01)
(Continued)

(52) U.S. Cl.
CPC ...... *H01L 21/02274* (2013.01); *H01L 21/0231* (2013.01); *H01L 21/02063* (2013.01); *H01L 21/02101* (2013.01); *H01L 21/302* (2013.01);
(Continued)

(58) Field of Classification Search
CPC ..... H01L 21/02; H01L 21/302; H01L 21/268; H01L 21/306; H01L 21/312; H01L 21/31116; H01L 21/31144; H01L 21/32136; H01L 21/32139; H01L 21/32137; H01L 21/31111; H01L 21/3065; H01L 21/02046; H01L 21/32134; H01L 21/02052; H01L 21/02063; H01L 21/02071; H01L 21/31; H01L 21/469; H01L 21/4763; H01L 21/768; H01L 21/76892; H01L 2924/14; H01L 2924/1079; H01L 2924/01078
USPC .................................................. 438/637, 633
See application file for complete search history.

(56) References Cited

U.S. PATENT DOCUMENTS

| 2011/0092078 A1* | 4/2011 | Rogojina ............... B82Y 30/00 438/765 |
| 2011/0117678 A1* | 5/2011 | Varadarajan ........ H01L 21/3105 438/4 |
| 2013/0098869 A1* | 4/2013 | Yu ......................... G03F 7/0002 216/49 |

FOREIGN PATENT DOCUMENTS

| CN | 102074500A A1 | 5/2011 |
| CN | 103531535A A1 | 1/2014 |

*Primary Examiner* — Chuong A Luu

(57) ABSTRACT

A method for repairing damages to sidewalls of an ultra-low dielectric constant film is disclosed by the present invention comprises the following steps: depositing an ultra-low dielectric constant film on an semiconductor substrate; dry-etching the ultra-low dielectric constant film to form a sidewall structure thereof; performing wet cleaning by using a chemical agent containing an unsaturated hydrocarbon having —O—C(Re)x; and performing ultraviolet curing. The present invention can restore pores size and porosity of the ultra-low dielectric constant film, and to keep effective dielectric constant to a minimum.

7 Claims, 2 Drawing Sheets

(51) Int. Cl.
*H01L 21/768* (2006.01)
*H01L 21/3105* (2006.01)

(52) U.S. Cl.
CPC ...... *H01L 21/3105* (2013.01); *H01L 21/76814* (2013.01); *H01L 21/76826* (2013.01)

METHOD FOR REPAIRING DAMAGES TO SIDEWALLS OF AN ULTRA-LOW DIELECTRIC CONSTANT FILM

CROSS-REFERENCE TO RELATED APPLICATION

This application claims the priority benefit of International Patent Application Serial No. PCT/CN2014/084099, filed Aug. 11, 2014, which is related to and claims the priority benefit of China patent application serial No. 201310525014.0, filed Oct. 30, 2013. The entirety of each of the above-mentioned patent applications is hereby incorporated by reference herein and made a part of this specification.

FIELD OF THE INVENTION

The present invention generally relates to the field of semiconductor integrated circuit, more particularly, to a method for repairing damages to sidewalls of an etched ultra-low dielectric constant film.

BACKGROUND OF THE INVENTION

In the semiconductor industry, an integrated circuit chip with high performance needs lowest possible RC time delay and signal crosstalk; therefore, a low dielectric constant material is required to be filled between the low resistance copper wires and the wiring layers to decrease parasitic capacitance, so as to improve the performance of the device. In the last ten years, researches on ultra-low dielectric constant materials are increasing in the semiconductor industry. In the process of integrated circuit, the ultra-low constant materials have to satisfy multiple key performance indicators, such as: adequate mechanical strength to support multi-layer interconnect structure, high Young's modulus, high breakdown voltage, low current leakage, high thermal stability, high adhesive strength, low moisture uptake, low film stress, high planarization capacity, low thermal expansion coefficient and compatibility with chemical mechanical polishing process, etc.

Carbon doping and micro-pore forming are effective methods to decrease the dielectric constant (k value). In the present sub-45 nm technology, the carbon-doped porous silicon oxide film with Si—C bonds is generally used as the ultra-low dielectric constant insulating material. Wherein the dielectric constant of the carbon-doped silicon oxide has a linear relationship with the density thereof, the lower the density, the lower the K value; the dielectric constant of the microporous material is also related to the porosity thereof, wherein the higher the porosity, the lower the k value.

However, with the requirement for decreasing the dielectric constant of the dielectric material, the porosity and carbon content of the dielectric material are increasing and the structure of the dielectric material are becoming more and more loose. In the subsequent dry-etching process, plasma of the etching process would break the Si—C bonds at the sidewalls; and then the hydroxyl group (OH) contained in the chemical agents used in the subsequent wet cleaning process, will replace C in the Si—C bonds, to form Si—OH, which will decrease the porosity and pores' diameter of the ultra-low dielectric constant (ULK) film, thereby causing the value of dielectric constant k to increase. In addition, since the —OH is easy to absorb the moisture or other impurities in the air, the Si in the ultra-low dielectric material is easy to be consumed under the temperature of the subsequent processes, which will causes an increase in the value of dielectric constant k and the critical dimension (CD).

BRIEF SUMMARY OF THE DISCLOSURE

Accordingly, an objective of the present invention is to provide a method for repairing damages to sidewalls of an ultra-low dielectric constant film, which can repair the sidewalls damages generated from etching the ultra-low dielectric constant film, avoid the increase in the dielectric constant, prevent the critical dimension (CD) from enlarging after etching, and be compatible with conventional industrial processes To achieve the above purposes, the present invention provides a method for repairing damages to sidewalls of an ultra-low dielectric constant film, the method comprises the following steps: depositing an ultra-low dielectric constant film on a semiconductor substrate, wherein the ultra-low dielectric constant film is a carbon-doped porous silicon oxide film; dry-etching the ultra-low dielectric constant film to form a sidewall structure thereof; performing wet cleaning by using a chemical agent containing an unsaturated hydrocarbon having —O—C(Re)x, during which the unsaturated hydrocarbon having —O—C(Re)x combines with Si in the sidewall structure of the ultra-low dielectric constant film to form Si—O—C(Re)x, wherein the C(Re)x is a molecular formula for unsaturated hydrocarbon having —$CH_3$; and performing ultraviolet curing to break the O—C bonds of the Si—O—C(Re)x, so as to form an annular $SiO_xO_y(CH_3)_z$ compound, wherein x, y and z are all positive integers.

Preferably, the temperature range for wet cleaning is from 20° C. to 40° C. and the time range for wet cleaning is from 15 seconds to 80 seconds.

Preferably, the temperature range for ultraviolet curing is from 380° C. to 500° C. and the time range for ultraviolet curing is from 10 seconds to 25 seconds.

Preferably, the ultraviolet curing is performed in a hydrogen gas environment, and the flux of the hydrogen gas is from 80 sccm to 120 sccm.

Preferably, the ultra-low dielectric constant film is formed by a plasma enhanced chemical vapor deposition process.

Preferably, the reactant gases of the plasma enhanced chemical vapor deposition process are diethoxymethylsilane and oxygen, the chamber temperature range is from 350° C. to 480° C. and the direct current power range is from 350 watts to 600 watts.

Preferably, the sidewall structure is the sidewalls of vias and trenches of damascene structure.

The present invention, the method for repairing damage to sidewalls of an ultra-low constant film has beneficial effects of restoring pores size and the porosity of the ultra-low dielectric constant film, so as to keep the effective dielectric constant value (k value) to a minimum. In addition, the wet chemical agent used in the present invention has high selectivity and low manufacturing cost; and the device used for the ultraviolet curing is compatible with conventional devices.

DETAILED DESCRIPTION OF THE EMBODIMENTS

The present invention will now be descried more fully hereinafter with reference to the accompanying drawings. It will be understood that various changes in form and details may be made herein without departing from the spirit and scope of the invention; and the embodiments and drawings are substantially used for illustrating the invention and should not be used as limitation to the present invention. It should be noted that the drawings are not necessarily to scale, emphasis instead being placed upon illustrating the principles of the present invention.

Figure 1:
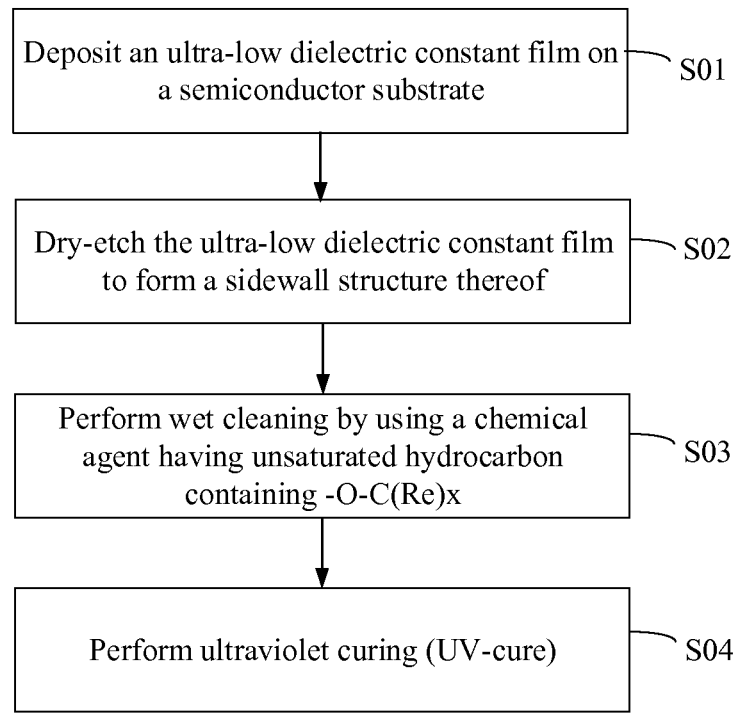
FIG. 1 is a flow chart of the method for repairing damages to sidewalls of an ultra-low dielectric constant film according to one embodiment of the present invention.

Referring to FIG. 1, the method for repairing damages to sidewalls of the ultra-low dielectric constant film according to one embodiment of the present invention includes the following steps:

Step S01: depositing an ultra-low dielectric constant film on a semiconductor substrate;

Step S02: dry-etching the ultra-low dielectric constant film to form a sidewall structure thereof;

Step S03: performing a wet cleaning process by using a chemical agent containing an unsaturated hydrocarbon having —O—C(Re)x;

Step S04: performing an ultraviolet curing process (UV-cure).

Figure 2A:
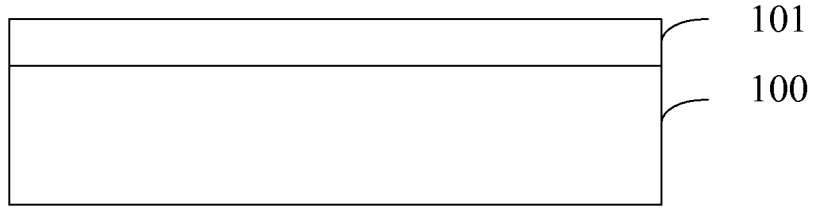
FIGS. 2A to 2C are cross sectional views illustrating the method for repairing damages to sidewalls of an ultra-low dielectric constant film according to one embodiment of the present invention.
Figure 2B:
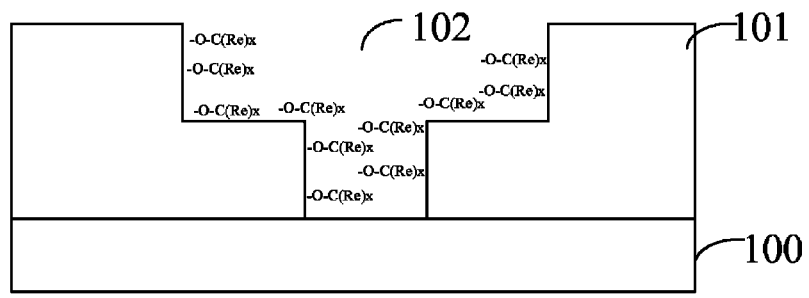

The method for repairing damages to sidewalls of the ultra-low dielectric constant film according to one embodiment of the present invention will be described in further detail hereinafter with the FIGS. 2A to 2C.

Firstly, referring to FIG. 2A, an ultra-low dielectric constant film 101 is deposited on a semiconductor substrate 100, wherein the ultra-low dielectric constant film 101 is a carbon-doped porous silicon oxide film, the value of dielectric constant is generally below or equal to 2.6, preferably, between 2.2 and 2.6. The ultra-low dielectric constant film 101 is deposited on the semiconductor substrate 100 by a plasma enhanced chemical vapor deposition process (PECVD); the reactant gases of the plasma enhanced chemical vapor deposition process are diethoxymethylsilane (DEMS) and oxygen ($O_2$), the chamber temperature is in range of 350° C. to 480° C. and the direct current power is in range of 350 watts to 600 watts.

Subsequently, referring to FIG. 2B, a sidewall structure is formed in the ultra-low dielectric constant film 101 by a dry-etching process; in the embodiment, a damascene structure 102 is formed in the ultra-low dielectric constant film 101 by a conventional dry-etching process, which can be via-first process, trench-first process, or all-in-one process (the vias and trenches are etched simultaneously). Due to the detailed procedure of the conventional dry-etching process is known by the person skilled in this field, therefore needs no further explanation here. While in other embodiments of the present invention, the sidewall structure after etching can be via only or trench only. During the dry-etching process, the plasma would break the Si—C bonds of the carbon-doped porous silicon oxide at the sidewalls of the ultra-low dielectric constant film 101, which is the sidewalls of the vias and the trenches of the damascene structure 102.

Next, performing wet cleaning by using a chemical agent containing an unsaturated hydrocarbon having —O—C(Re)x. Herein, the unsaturated hydrocarbon having —O—C(Re)x replaces the C of the broken Si—C bonds, to combine with the Si, so as to form Si—O—C(Re)x; herein C(Re)x is a general molecular formula of an unsaturated hydrocarbon having —$CH_3$. Compared with the saturated hydrocarbon, the unsaturated hydrocarbon in the chemical agent is easy to react with the Si, and to replace the C in the Si—C bonds. In addition, the bond energy of the O in the unsaturated hydrocarbon is relatively low, thus, the O—$CH_3$ bonds are easier to be broken in the subsequent steps. Preferably, in this step, the temperature range for wet cleaning is from 20° C. to 40° C. and the time range for wet cleaning is from 15 seconds to 80 seconds.

Figure 2C:
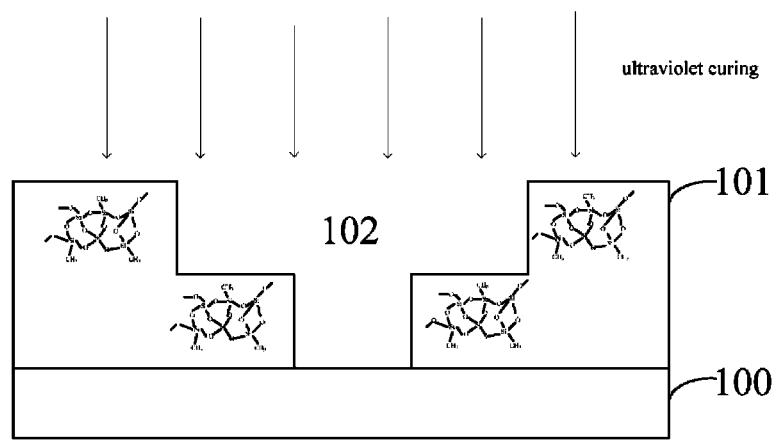

Next, Referring to FIG. 2C, performing ultraviolet curing to the above-mentioned sidewall structure, wherein the temperature range for ultraviolet curing is from 380° C. to 500° C. and the time range for ultraviolet curing is from 10 seconds to 25 seconds. In the embodiment, the ultraviolet curing is performed in a hydrogen gas ($H_2$) environment, and the flux of the hydrogen gas is from 80 sccm to 120 sccm. As mentioned above, since the O in the unsaturated hydrocarbon has relatively low bond energy, after being ultraviolet cured, the O—C bonds in the Si—O—C(Re)x are broken by the high intensity ultraviolet light to form an annular $SixOy(CH_3)z$ compound with mainly Si—O bonds, wherein x, y and z are all positive integers. Herein take an example for illustration, the reaction formula for the ultraviolet curing shown as below:

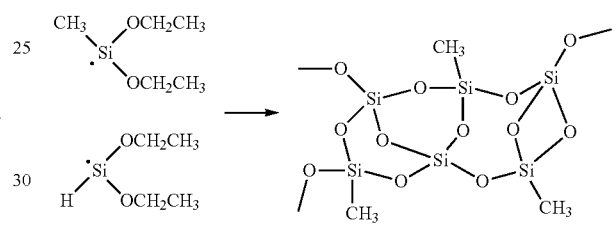

As shown in the above reaction formula, the O—C bonds in the Si—O—C(Re)x on the left side are broken to form an annular $SixOy(CH_3)z$ compound, which has Si—O as backbone, therefore enlarges the Si—O—Si circular, so as to restore the pores size and the porosity of the ultra-low dielectric constant film, to keep the effective dielectric constant to a minimum.

After the aforementioned steps, other Cu back-end-of-line processes for forming the CMOS devices can be performed. Those processes are readily apparent to those skilled in the art, therefore needs no further explanation here.

The method for repairing damages to sidewalls of the ultra-low dielectric constant film according to the present invention can restore the pores size and the porosity of the ultra-low dielectric constant film, so as to keep the effective dielectric constant to a minimum; in addition, the wet chemical agent used in the present invention has high selectivity and low manufacturing cost; and the device used for the ultraviolet curing is compatible with conventional devices. Therefore, the method for repairing damages to the sidewalls of the ultra-low dielectric constant film according to the present invention has the following advantages: simple process, easy integration, and good compatibility with CMOS process, which has a great application value.

While this invention has been particularly shown and described with references to preferred embodiments thereof, it will be understood by those skilled in the art that various changes in form and details may be made therein without departing from the spirit and scope of the invention as defined by the appended claims.

The invention claimed is:

1. A method for repairing damages to sidewalls of an ultra-low dielectric constant film comprises the following steps:

step S01: depositing an ultra-low dielectric constant film on a semiconductor substrate, wherein the ultra-low dielectric constant film is a carbon-doped porous silicon oxide film;

step S02: dry-etching the ultra-low dielectric constant film to form a sidewall structure in the ultra-low dielectric constant film, wherein Si—C bonds of the carbon-doped porous silicon oxide film at the sidewall structure are broken during the dry-etching process;

step S03: performing wet cleaning by using a chemical agent containing an unsaturated hydrocarbon having —O—C(Re)x; the unsaturated hydrocarbon having —O—C(Re)x replaces C of the broken Si—C bonds and combines with Si of the broken Si—C bonds to form Si—O—C(Re)x, wherein the C(Re)x is a molecular formula of an unsaturated hydrocarbon having —$CH_3$; and step S04: performing ultraviolet curing to break O—C bonds of the Si—O—C(Re)x, so as to form an annular $Si_xO_y(CH_3)_z$ compound having a backbone made of Si—O—Si, wherein x, y and z are all positive integers.

2. The method according to claim 1, wherein temperature range for wet cleaning is from 20° C. to 40° C. and time range for wet cleaning is from 15 seconds to 80 seconds.

3. The method according to claim 1, temperature range for ultraviolet curing is from 380° C. to 500° C. and time range for ultraviolet curing is from 10 seconds to 25 seconds.

4. The method according to claim 1, wherein the ultraviolet curing is performed in a hydrogen gas environment, and flux of the hydrogen gas is from 80 sccm to 120 sccm.

5. The method according to claim 1, wherein the ultra-low dielectric constant film is formed by a plasma enhanced chemical vapor deposition process.

6. The method according to claim 5, wherein reactant gases of the plasma enhanced chemical vapor deposition process are diethoxymethylsilane and oxygen, chamber temperature range is from 350° C. to 480° C. and direct current power range is from 350 watts to 600 watts.

7. The method according to claim 1, wherein the sidewall structure is the sidewalls of vias and trenches of damascene structure.

* * * * *